(12) United States Patent
Lee et al.

(10) Patent No.: US 8,451,040 B2
(45) Date of Patent: May 28, 2013

(54) FLIP-FLOP CIRCUITS

(75) Inventors: Hoijin Lee, Gangnam-gu (KR); Gunok Jung, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 97 days.

(21) Appl. No.: 12/963,174

(22) Filed: Dec. 8, 2010

(65) Prior Publication Data

US 2011/0140751 A1    Jun. 16, 2011

(30) Foreign Application Priority Data

Dec. 11, 2009    (KR) .................. 10-2009-0123440

(51) Int. Cl.
*H03K 3/356*    (2006.01)

(52) U.S. Cl.
USPC ........... 327/210; 327/208; 327/212; 327/218; 327/225; 326/95; 326/98

(58) Field of Classification Search
USPC ......... 327/199–201, 208–214, 218, 223–225; 326/93–98
See application file for complete search history.

(56) References Cited

U.S. PATENT DOCUMENTS

| | | | | |
|---|---|---|---|---|
| 3,862,440 A * | 1/1975 | Suzuki et al. | ................. | 327/178 |
| 4,813,044 A * | 3/1989 | Kumar et al. | ................. | 714/809 |
| 6,208,583 B1 | 3/2001 | Fujiwara | | |
| 6,211,713 B1 * | 4/2001 | Uhlmann | ................. | 327/211 |
| 6,433,603 B1 * | 8/2002 | Singh et al. | ................. | 327/211 |
| 6,608,513 B2 * | 8/2003 | Tschanz et al. | ................. | 327/218 |
| 6,980,040 B2 | 12/2005 | Jang et al. | | |
| 7,202,724 B2 * | 4/2007 | Kim | ................. | 327/218 |
| 7,548,102 B2 * | 6/2009 | Ramaraju et al. | ................. | 327/202 |
| 2009/0237137 A1 * | 9/2009 | Kim | ................. | 327/211 |

FOREIGN PATENT DOCUMENTS

| | | |
|---|---|---|
| JP | 2000-137998 | 5/2000 |
| KR | 1020040092778 | 11/2004 |
| KR | 1020050049236 | 5/2005 |

* cited by examiner

*Primary Examiner* — Patrick O'Neill
(74) *Attorney, Agent, or Firm* — F. Chau & Associates, LLC

(57) ABSTRACT

A flip-flop circuit includes an input portion that receives a first external input signal through a first external input terminal, a storage portion that stores a signal transmitted from the input portion, and an output portion that outputs the signal stored in the storage portion through an external output terminal as a logic operation result with respect to a second external input signal received through a second external input terminal of the input portion. The output portion includes a logic gate directly connected to the external output terminal and an input terminal of the logic gate receives the signal stored in the storage portion.

4 Claims, 6 Drawing Sheets

FLIP-FLOP CIRCUITS

CROSS-REFERENCE TO RELATED APPLICATION

This application claims under 35 U.S.C. §119 priority to and the benefit of Korean Patent Application No. 10-2009-0123440, filed on Dec. 11, 2009, the entire content of which is incorporated by reference herein.

BACKGROUND

The present disclosure relates to semiconductor integrated circuits (ICs), and more particularly, to flip-flop circuits used therein.

Through the development of ICs, various electronic devices including computers have the characteristics of high reliability, high speed, low power and miniaturization. As such electronic devices become more and more highly integrated, the complexity of circuits increases. For example, a very large scale IC (VLSI) can integrate more than one hundred thousand transistors in one chip. Thus, the implementation of a complicated IC is considered to be an important factor in determining the performance of an IC.

In particular, in an application specific IC (ASIC), a standard cell is used as an efficient logic device. The standard cell typically includes multiple transistors and provides logic functions (AND, OR, XOR and the like) and storage functions (Flip-Flop, latch and the like). Also, various standard cells that perform different functions can constitute a standard cell library.

A flip-flop that performs a storage function is a basic circuit which can maintain one bit information in two stable states using a structure that has a delayed output with respect to an input and that feeds back to the input. There are various kinds of flip-flops such as a data or delay (D) flip-flop, a reset-set (RS) flip-flop, a JK flip-flop and a toggle (T) flip-flop.

Flip-flops have a high processing speed and are mainly used in small devices requiring high speed, such as registers of a microprocessor. However, since a flip-flop has a complicated structure to maintain one bit information, the cost per one bit increases as integration becomes high. Therefore, a need exists for flip-flop circuits that can be effective for use in highly integrated ICs.

SUMMARY

According to an exemplary embodiment of the inventive concept a flip-flop circuit includes an input portion that receives a first external input signal through a first external input terminal, a storage portion that stores a signal transmitted from the input portion, and an output portion that outputs the signal stored in the storage portion through an external output terminal as a logic operation result with respect to a second external input signal received through a second external input terminal of the input portion. The output portion includes a logic gate directly connected to the external output terminal and an input terminal of the logic gate receives the signal stored in the storage portion.

The input portion may receive the second external input signal as a clock signal, and then transmits the first input signal to the storage portion in response to the clock signal.

The storage portion may include a latch circuit.

The logic gate may be an inverter.

The logic gate may be a NAND gate.

The logic gate may be a NOR gate.

According to an exemplary embodiment a flip-flop circuit includes a first input terminal that receives a first external input signal, a second input terminal that receives a second external input signal, a storage portion that stores the first external input signal, and a logic gate directly connected to an external output terminal. The storage portion is connected to a first inner input terminal of the logic gate and a second external input terminal is connected to a second inner input terminal of the logic gate.

The storage portion may include a latch circuit and an input portion coupled to the latch circuit and that receives the first external input signal. The input portion includes of a plurality of MOS transistors connected in series.

The plurality of MOS transistors may include two MOS transistors coupled together to form an inverter.

According to an exemplary embodiment a semiconductor integrated circuit includes a flip-flop circuit that stores data, and a load circuit connected to an external output terminal of the flip-flop circuit. The flip-flop circuit includes an input portion that receives a first external input signal through a first external input terminal, a storage portion that stores a signal transmitted from the input portion, and an output portion that outputs the signal stored in the storage portion through an external output terminal as a logic operation result with respect to a second external input signal received through a second external input terminal of the input portion. The output portion includes a logic gate directly connected to the external output terminal and an input terminal of the logic gate receives the signal stored in the storage portion.

According to an exemplary embodiment a flip flop pair circuit has a pair of flip-flops, each having a pair of flip flop input terminals and a flip flop output terminal. Each flip flop output terminal is connectable to a respective one of a pair of load input terminals. Each flip flop includes an input portion coupled to the pair of flip flop input terminals, a latch circuit coupled to the first input portion, an output portion coupled to the latch circuit, and a pulse generator that receives a clock signal at one of the pair of flip flop input terminals and outputs a pulse signal to the input portion. Each flip flop operates such that the input portion transmits an input portion output signal with respect to an external input signal applied to an other of the pair of flip flop input terminals to the latch circuit in response to the pulse signal, the latch circuit stores one bit data information with respect to the input portion output signal, and the output portion outputs from the flip flop output terminal to a respective one of the pair of load terminals the data information stored in the respective latch circuit.

Each input portion may include a first PMOS transistor, a second PMOS, a first NMOS transistor, a second NMOS transistor sequentially and serially connected to one another between a supply voltage terminal and a ground, and an inverter. The second PMOS transistor and the first NMOS transistor may form an inverter. The pulse signal may be inputted into a gate of the first PMOS transistor through the inverter. The clock signal may be inputted into a gate of the second NMOS transistor. The input signal may be inputted into a gate of the second PMOS transistor and a gate of the first NMOS transistor, such that when the pulse signal is at a high level, the first PMOS transistor and the second NMOS transistor are turned on, and when the pulse signal is at a low level, the first PMOS transistor and the second NMOS transistor are turned off.

Each latch circuit may include two inverters coupled in a feedback loop between the input portion and the output portion.

Each output portion may be an inverter that outputs as an output signal to a respective one of the pair of load input terminals, an inversion value of data information that the latch circuit maintains.

An output portion of a first flip flop of the pair of flip flops may be an inverter that outputs as an output signal to one of the pair of load input terminals, an inversion value of data information that the latch circuit of the first flip flop maintains. An output portion of a second flip flop of the pair of flip flops may be a NAND gate that outputs a NAND operation result with respect to data information which the latch circuit of the second flip flop maintains and the output signal of the first flip flop, as an output signal of the second flip flop to the other of the pair of load input terminals.

According to an exemplary embodiment a flip-flop circuit includes an input portion configured to receive a first signal, a storage portion configured to receive a second signal outputted from the input portion, and an output portion configured to receive a third signal outputted from the storage portion, to receive a fourth signal outputted from another flip-flop circuit, and to perform a logic operation using the third signal and the fourth signal.

The second signal may be an inverted signal of the first signal, and the third signal is the same signal as the second signal.

The logic operation performed by the output portion may be a NOR operation.

The output portion may be further configured to receive a fifth signal from a second another flip-flop circuit such that the output portion performs a logic operation using the third signal, the fourth signal, and the fifth signal.

The logic operation performed by the output portion may be a NOR operation.

The logic operation performed by the output portion may be a NAND operation.

According to an exemplary embodiment a logic circuit includes a first flip-flop circuit having a first flip-flop circuit input portion configured to receive a first flip-flop circuit first signal, a first flip-flop circuit storage portion configured to receive a first flip-flop circuit second signal outputted from the input portion, and a first flip-flop circuit output portion configured to receive a first flip-flop circuit third signal outputted from the first flip-flop circuit storage portion, and a second flip-flop circuit having a second flip-flop circuit input portion configured to receive a second flip-flop circuit first signal, a second flip-flop circuit storage portion configured to receive a second flip-flop circuit second signal outputted from the input portion, and a second flip-flop circuit output portion configured to receive a second flip-flop circuit third signal outputted from the second flip-flop circuit storage portion, to receive the first flip-flop circuit third signal, and to perform a logic operation using the first flip-flop circuit third signal and the second flip flop circuit third signal.

The logic operation performed by the second flip-flop circuit output portion may be a NAND operation.

BRIEF DESCRIPTION OF THE DRAWINGS

The accompanying drawings illustrate exemplary embodiments of the inventive concept and, together with the description, serve to explain the principles of the inventive concept. In the figures.

DETAILED DESCRIPTION OF THE EMBODIMENTS

In the exemplary embodiments described below like numbers refer to like elements throughout. Those skilled in the art will appreciate that in addition to the exemplary embodiments described herein, the inventive concept may be embodied in other different forms and should not be construed as limited to the embodiments set forth herein.

Figure 1:
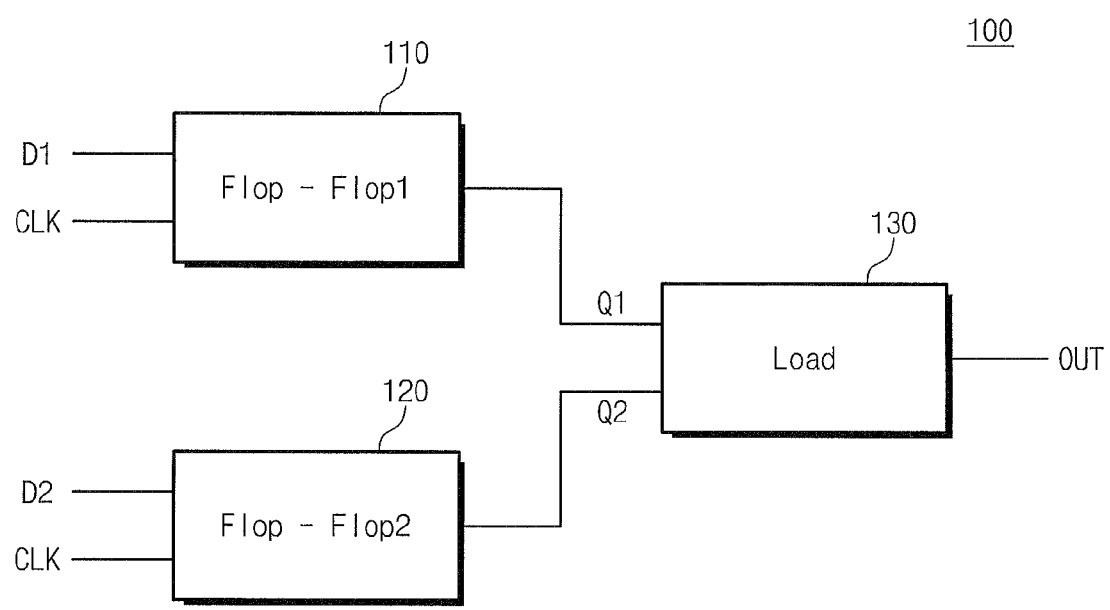
FIG. 1 is a block diagram illustrating a logic circuit using a flip-flop in accordance with an exemplary embodiment of the present inventive concept.

Referring first to FIG. 1, a logic circuit 100 includes a first flip-flop 110, a second flip-flop 120 and a load 130. Output terminals of the first and second flip-flops 110, 120 are connected to an input terminal of the load 130, respectively.

The first flip-flop 110 outputs a first output signal Q1 with respect to a first external input signal D1 in response to a clock signal CLK. The second flip-flop 110 outputs a second output signal Q2 with respect to a second external input signal D2 in response to a clock signal CLK. The load 130 receives the first and second output signals Q1, Q2 as input signals from the first and second flip-flops 110, 120, respectively. The load 130 outputs an output signal OUT with respect to the input signal of the load 130 according to an internal logic operation.

The first flip-flop 110, the second flip-flop 120 and the load 130 may include combinations of a plurality of logic gates, respectively, such as inverters, AND gates, OR gates, NAND gates, NOR gates and/or XNOR gates. A path between an input and an output of each of the first flip-flop 110, the second flip-flop 120 and the load 130 may be different depending upon the number of logic gates and the types of logic gates. For example, a path with respect to the first external input signal D1 may include two inverters and one AND gate. On the other hand, a path with respect to the second input signal D2 may include one inverter, one AND gate and two NAND gates.

Whenever a path between an input and an output of each of the first flip-flop 110, the second flip-flop 120 and the load 130 passes through one logic gate, a logic operation delay occurs. Thus, when more logic gates that are used, more delays can occur. To reduce the delays and still provide the same logic operation, a circuit using fewer logic gates becomes needed.

Figure 2:
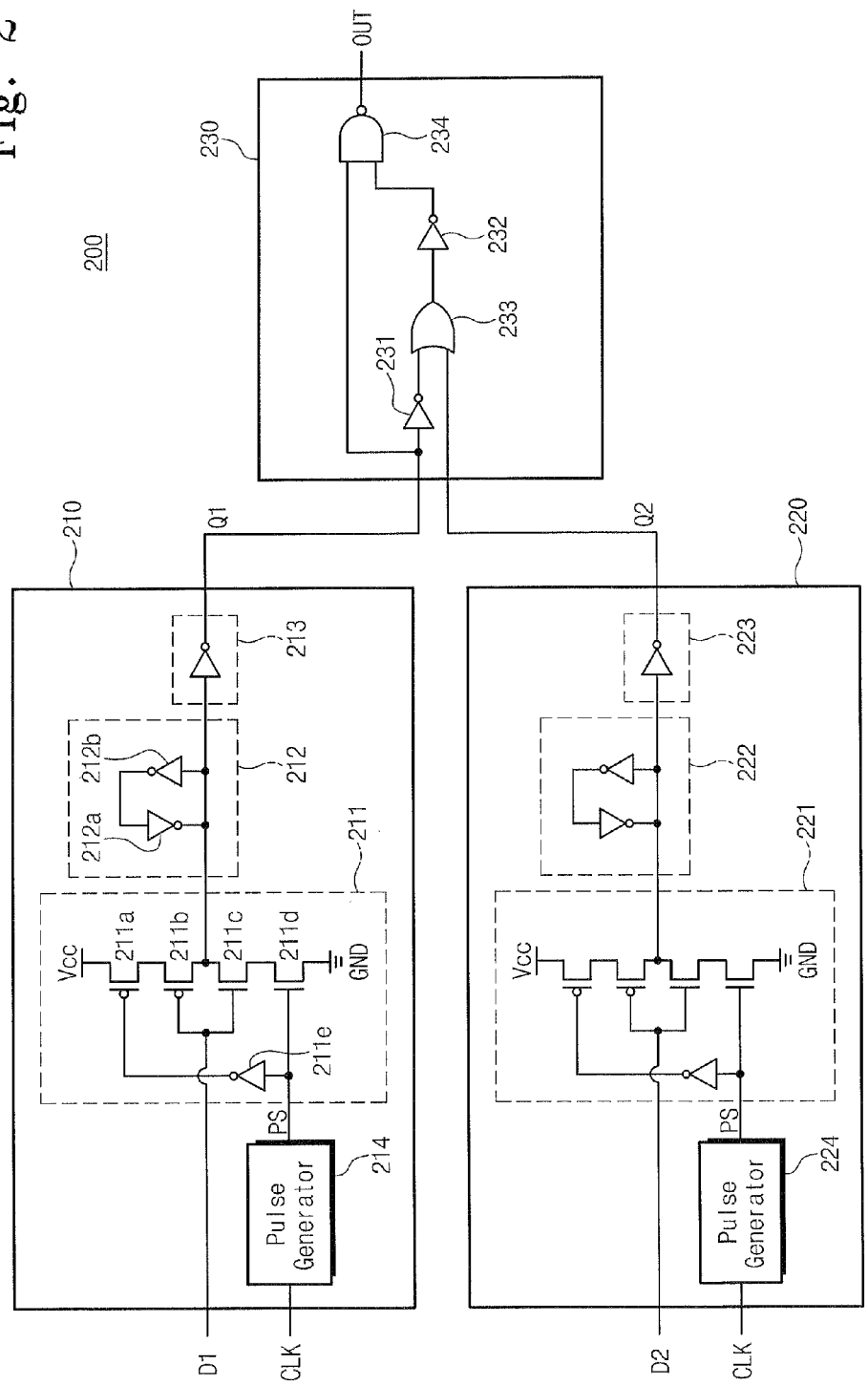
FIG. 2 is a circuit diagram of a logic circuit using a flip-flop in accordance with an exemplary embodiment of the present inventive concept.

FIG. 2 is a circuit diagram of a logic circuit using a flip-flop in accordance with an exemplary embodiment of the present inventive concept. A logic circuit 200 includes a first flip-flop 210, a second flip-flop 220 and a load 230. Output terminals of the first and second flip-flops 210, 220 are connected to the input terminals of the load 230, respectively.

The first flip-flop 210 includes a first input portion 211, a first latch circuit 212, a first output portion 213 and a first pulse generator 214. The pulse generator 214 receives a clock signal CLK, and then outputs a pulse signal PS having a pulse width smaller than the clock signal CLK. The first input portion 211 transmits an output signal with respect to a first external input signal D1 to the first latch circuit 212 in response to the pulse signal PS. The first latch circuit 212 stores one bit data information with respect to the output signal of the first input portion 211. The first output portion 213 outputs a first output signal Q1 with respect to the data information stored in the first latch circuit 212.

The first input portion 211 includes a first PMOS transistor 211a, a second PMOS transistor 211b, a first NMOS transistor 211c, a second NMOS transistor 211d and an inverter 211e. The first PMOS transistor 211a, the second PMOS transistor 211b, the first NMOS transistor 211c and the second NMOS transistor 211d are sequentially and serially connected to one another between a supply voltage terminal Vcc and a ground GND. Here, the second PMOS transistor 211b and the first NMOS transistor 211c constitute an inverter.

The pulse signal PS is inputted into a gate of the first PMOS transistor 211a through the inverter 211e. The clock signal CLK is inputted into a gate of the second NMOS transistor 211d. The input signal D1 is inputted into a gate of the second PMOS transistor 211b and a gate of the first NMOS transistor 211c.

When the pulse signal PS is at a high level, the first PMOS transistor 211a and the second NMOS transistor 211d are turned on. Thus, the second PMOS transistor 211b and the first NMOS transistor 211c become a state that can operate. That is, the second PMOS transistor 211b and the first NMOS transistor 211c output an inversion signal of the first external input signal D1 as an output signal.

When the pulse signal PS is at a low level, the first PMOS transistor 211a and the second NMOS transistor 211d are turned off. Thus, the second PMOS transistor 211b and the first NMOS transistor 211c become a state that cannot operate. That is, the second PMOS transistor 211b and the first NMOS transistor 211c do not respond to the first external input signal D1.

The first latch circuit 212 includes two inverters 212a, 212b constituting a feedback. One bit data information with respect to an output signal of the first input portion 211 can be maintained by the two inverters 212a, 212b providing the feedback.

The first output portion 213 is an inverter. Thus, the first output portion 213 outputs an inversion value of data information which the first latch circuit 212 maintains as the first output signal Q1. Also, the first output portion 213 drives a load connected to an output of the first flip-flop 210. The first output portion 213 maintains a constant internal impedance of the first flip-flop 210 so that the first flip-flop 210 is not affected by an external load.

As described above, the first input portion 211 outputs an inversion signal of the first external input signal D1 as an output signal in response to the pulse signal PS. The first latch circuit 212 maintains one bit data information with respect to the inversion signal of the first external input signal D1. The data information which the first latch circuit 212 maintains is inverted again by the first output portion 213. That is, the first output signal Q1 has the same value as the first external input signal D1.

The second flip-flop 220 includes a second input portion 221, a second latch circuit 222, a second output portion 223 and a second pulse generator 224. The pulse generator 224 receives a clock signal CLK, and then outputs a pulse signal PS having a pulse width smaller than the clock signal CLK. The second input portion 221 transmits an output signal with respect to a second external input signal D2 to the second latch circuit 222 in response to the pulse signal PS. The second latch circuit 222 stores one bit data information with respect to the output signal of the second input portion 221. The second output portion 223 outputs a second output signal Q2 with respect to the data information stored in the second latch circuit 222.

The structure and operation of the second flip-flop 220 are the same as the structure and the operation of the first flip-flop 210. Thus, further detailed descriptions of the second flip-flop 220 are omitted.

The load 230 includes a plurality of logic gates. In an exemplary embodiment the load 230 includes two inverters 231, 232, an OR gate 233 and a NAND gate 234.

Also, the load 230 receives the first output signal Q1 and the second output signal Q2 as input signals to perform a logic operation. In an exemplary embodiment a plurality of logic gates provide a logic operation in accordance with mathematical formula 1 below.

$$OUT=(Q1\cap(Q1'\cup Q2)')'$$ [mathematical formula 1]

Referring to the mathematical formula 1, the load 230 performs a NOT operation with respect to the first output signal Q1. An OR operation is performed on a result of the NOT operation and the second output signal Q2. A NOT operation is performed on a result of the OR operation. A NAND operation is performed on a result of the NOT operation and the first output signal Q1. A result of the NAND operation provides an output signal OUT of the load 230. Here, $\cap$, $\cup$ and ' symbols mean an AND, an OR and a NOT operation, respectively.

The two inverters 231, 232, the one OR gate 233 and the one NAND gate 234 are combined to perform a logic operation according to mathematical formula 1. The first output signal Q1 is inputted into one input terminal of the OR gate 233 through the inverter 231 and is directly inputted into one input terminal of the NAND gate 234. The second output signal Q2 is inputted into the other input terminal of the OR gate 233. An operation result of the OR gate 233 is inputted into the other input terminal of the NAND gate 234 through the inverter 232. The load 230 outputs an operation result of the NAND gate 234 as the output signal OUT.

The types, number and combination of the logic gates described above are only one exemplary embodiment. Therefore, the load 230 may include other logic gate arrangements that can provide a comparable logic result. For example, the OR gate 233 and inverter 232 which provide a NOR combination could be replaced by a combination of four NAND gates.

The first flip-flop 210 outputs the first output signal Q1 as an output signal with respect to the first input signal D1 in response to the clock signal CLK.

The second flip-flop 220 outputs the second output signal Q2 as an output signal with respect to the second input signal D2 in response to the clock signal CLK. The load 230 outputs a logic operation result as an output signal OUT with respect to the first and second output signals Q1, Q2.

To reduce the delay between the first external input signal D1 and the output signal OUT or between the second external input signal D2 and the output signal OUT, although the same logic operation is performed, a circuit using fewer logic gates may be provided.

A flip-flop in accordance with an exemplary embodiment of the present inventive concept can provide an output by a logic gate performing a logic operation with respect to two or more input signals instead of an inverter. Such an implementation can reduce the delay occurring while a signal passes through an inverter in a path between an input and an output. Also, the logic gate can perform a portion of the whole logic operation in the flip-flop. This will be described in more detail with reference to FIG. 3.

Figure 3:
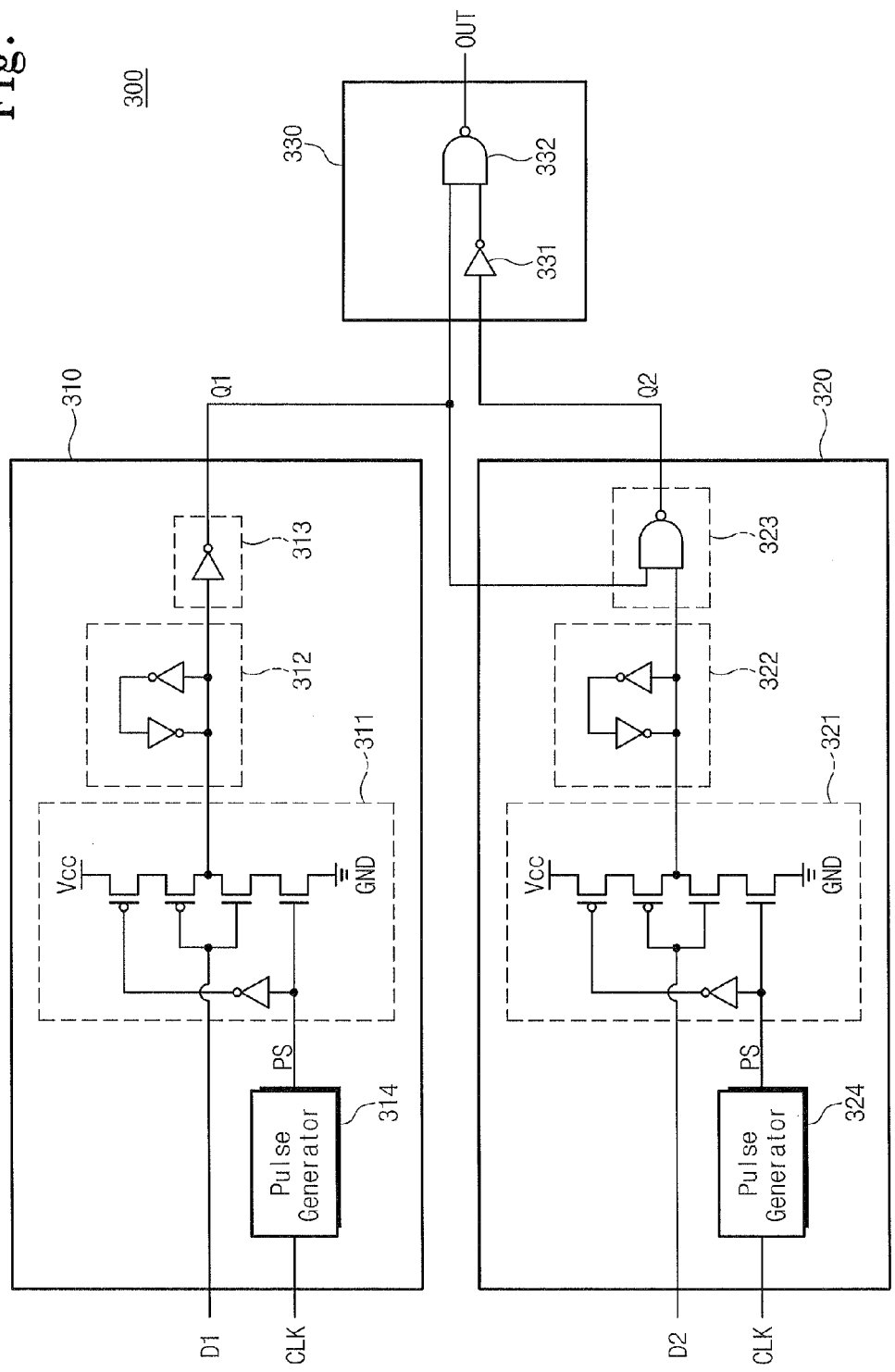
FIG. 3 is a circuit diagram of a logic circuit using a flip-flop in accordance with an exemplary embodiment of the present inventive concept.

FIG. 3 is a circuit diagram of a logic circuit using a flip-flop in accordance with an exemplary embodiment of the present inventive concept. Referring to FIG. 3, a logic gate 300 includes a first flip-flop 310, a second flip-flop 320 and a load 330. An output terminal of the first flip-flop 310 and an output terminal of the second flip-flop 320 are connected to input terminals of the load 330, respectively.

The first flip-flop 310 includes a first input portion 311, a first latch circuit 312, a first output portion 313 and a first pulse generator 314. The pulse generator 314 receives a clock signal CLK, and then outputs a pulse signal PS having a pulse width smaller than the clock signal CLK. The first input portion 311 transmits an output signal with respect to a first external input signal D1 to the first latch circuit 312 in response to the pulse signal PS. The first latch circuit 312 stores one bit data information with respect to the output signal of the first input portion 311. The first output portion 313 outputs a first output signal Q1 with respect to the data information stored in the first latch circuit 312.

The structure and operation of the first flip-flop 310 are the same as those of the first flip-flop 210 illustrated in FIG. 2. Thus, a further detailed description of the first flip-flop 310 is omitted.

The second flip-flop 320 includes a second input portion 321, a second latch circuit 322, a second output portion 323 and a second pulse generator 324. The pulse generator 324 receives a clock signal CLK, and then outputs a pulse signal PS having a pulse width smaller than the clock signal CLK. The second input portion 321 transmits an output signal with respect to a second external input signal D2 to the second latch circuit 322 in response to the pulse signal PS. The second latch circuit 322 stores one bit data information with respect to the output signal of the second input portion 321. The second output portion 323 is connected to an output of the first flip-flop 310. Thus, the first output signal Q1 is transmitted from the first flip-flop 310 to the second output portion 323. The second output portion 323 outputs a logic operation result with respect to data information stored in the second latch circuit 322 and the first output signal Q1 as a second output signal Q2.

The structure and operation of the second input portion 321 and the second latch circuit 322 are the same as those of the second input portion 221 and the second latch circuit 222 illustrated in FIG. 2. Thus, detailed descriptions of the second input portion 221 and the second latch circuit 222 are omitted.

The second output portion 323 includes a NAND gate. Thus, the second output portion 323 outputs a NAND operation result with respect to data information which the second latch circuit 322 maintains and the first output signal Q1 as a second output signal Q2. Also, the second output portion 323 drives a load connected to an output terminal of the second flip-flop 320. The second output portion 323 maintains a constant internal impedance of the second flip-flop 320 so that the second flip-flop 320 is not affected by an external load.

Referring again to FIG. 2 and to mathematical formula 2 below, an inverter of the second output portion 223, and the inverter 231 and the OR gate 233 in the load 230 may include a NAND gate. That is, a NAND gate performs the same logic operation as an OR gate of which both inputs are connected to inverters, respectively.

$$Q1 \cup Q2' = (Q1 \cap Q2)'$$ [mathematical formula 2]

The logic circuit 200 may be implemented such that the NAND gate is included in the first flip-flop 210 or the second flip-flop 220. That is, the first output portion 213 and the second output portion 223 may include a NAND gate.

The mathematical formula 2 explains the De-Morgan law of Boolean Algebra, a formal rule relating the logical operators "and" and "or" in terms of each other. ∩, ∪ and ' symbols mean an AND, an OR and a NOT operations, respectively.

Referring back to FIG. 3, in an exemplary embodiment the load 330 includes one inverter 331 and one NAND gate 332. The load 230 receives the first output signal Q1 and the second output signal Q2 as an input signal to perform a logic operation. Here, the inverter 331 and the NAND gate 332 are combined to perform a logic operation according to mathematical formula 3 below.

According to mathematical formula 3 below, a NOT operation is performed on the second output signal Q2. A NAND operation is performed on a result of the NOT operation and the first output signal Q1. A result of the NAND operation corresponds to an OUT of the load 230. ∩ and ' symbols mean an AND and a NOT operation, respectively.

$$OUT = (Q1 \cap Q2')'$$ [mathematical formula 3]

The inverter 331 and the NAND gate 332 are combined to perform a logic operation by the mathematical formula 3. The first output signal Q1 is inputted into one input terminal of the NAND gate 332. The second output signal Q2 is inputted into the other input terminal of the NAND gate 332 through the inverter 331. The load 330 outputs an operation result of the NAND gate 332 as an output signal OUT.

Referring to FIGS. 2 and 3, as mentioned above, the NAND gate performs the same logic operation as an OR gate of which both inputs are connected to inverters, respectively. That is, a NAND gate of the second output portion 323 in FIG. 3 is equal to the combinations of an inverter of the second output portion 223 in FIG. 2, the inverter 231 and the OR gate 233 in the load 230. Thus, a logic operation result of the logic circuit 200 in FIG. 2 is the same as a logic operation result of the logic circuit 300 in FIG. 3.

Consequently, when comparing FIG. 3 with FIG. 2, one inverter disposed at a path between an input and an output can be reduced by providing an output portion of the flip-flop with a NAND gate instead of an inverter. This means that a delay reduction for one stage having an inverter can be obtained while the logic operational result is not affected.

The flip-flops described in FIGS. 2 and 3 are merely exemplary embodiments of the present inventive concept. The flip-flops may be a D flip-flop, a RS flip-flop, a JK flip-flop and a T flip-flop. That is, a type of the flip-flop is not limited. Although flip-flops have the same type, they may have different inner structures. For example, the flip-flop may be of a master-slave type where two basic flip-flops (plus some additional logic) collaborate to make it insensitive to spikes and noise between short clock transitions.

Also, including a NAND gate in an output of a flip-flop is just an exemplary embodiment. The flip-flop in accordance with the present inventive concept may include a logic operation block such as an AND, an OR, a NOR, an XOR and an XNOR gates having two or more input terminals at an output portion. This means that a logic operation function may be added to the flip-flop. This also means that the flip-flop may include a plurality of input terminals for receiving data.

Although in accordance with the exemplary embodiments the same logic operation is performed, the inner structure of the components that implement the logic operation block can vary. That is, logic operation components that perform the same logic operation can be implemented by combining transistors using various methods.

Figure 4:
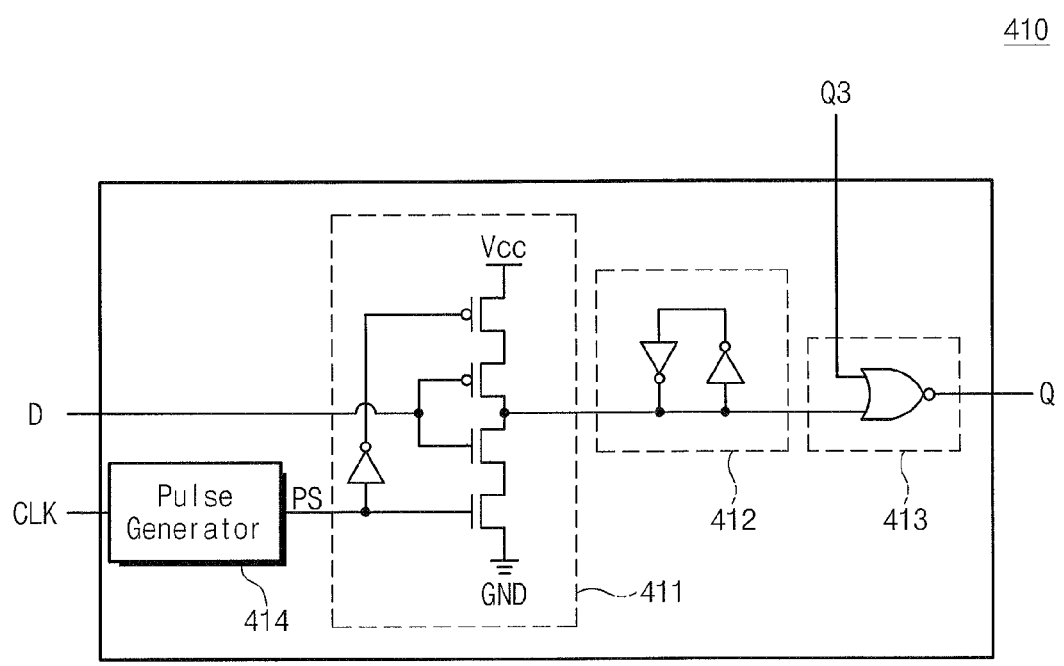
FIGS. 4, 5 and 6 are flip-flop circuits in accordance with exemplary embodiments of the present inventive concept.
Figure 5:
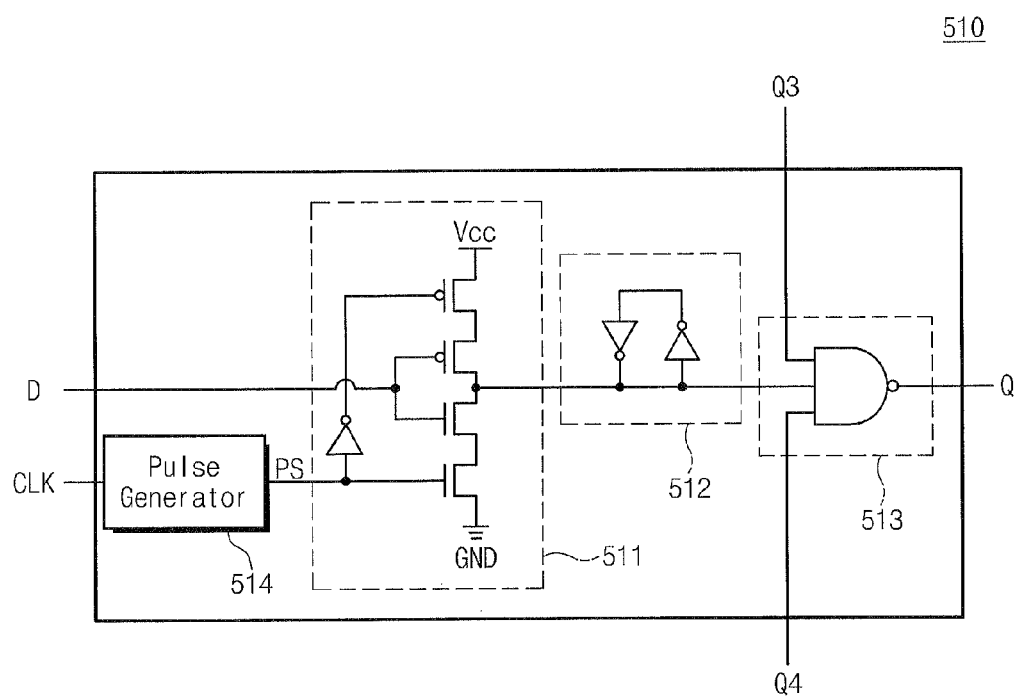
Figure 6:
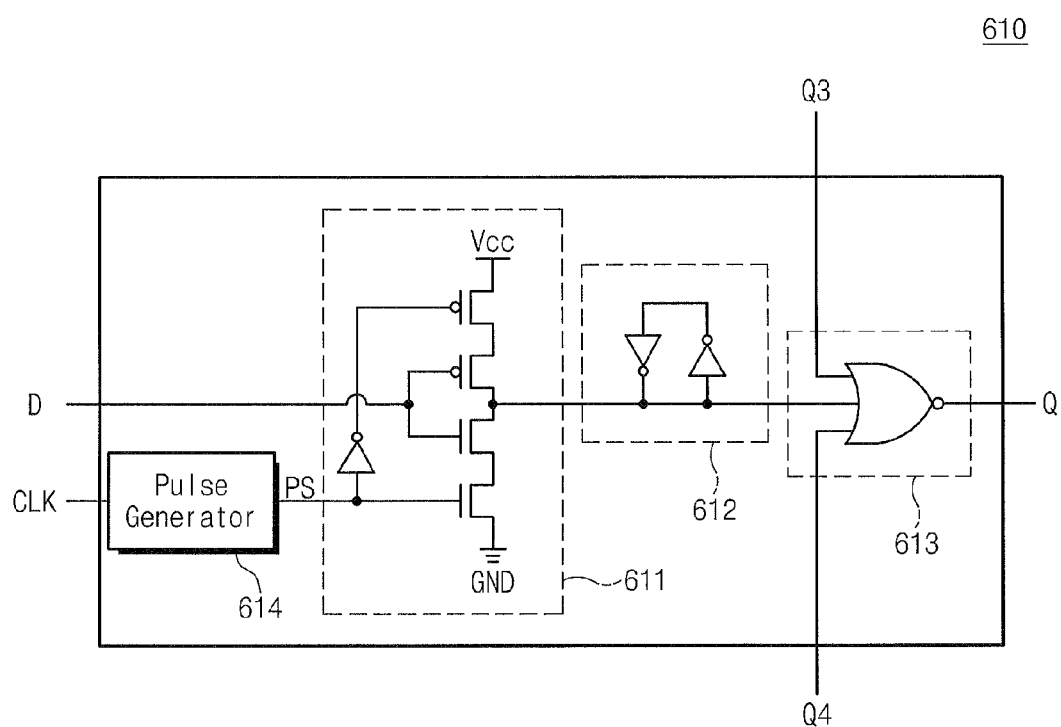

FIGS. 4, 5 and 6 are flip-flop circuits in accordance with further exemplary embodiments of the present inventive concept.

Referring to FIG. 4, a flip-flop 410 includes an input portion 411, a latch circuit 412, an output portion 413 and a pulse generator 414. The pulse generator 414 receives a clock signal CLK, and then outputs a pulse signal PS having a pulse width smaller than the clock signal CLK. The input portion 411 transmits an output signal with respect to an external input signal D to the latch circuit 412 in response to the pulse signal PS. The latch circuit 412 stores one bit data information with respect to the output signal of the input portion 411. The output portion 413 includes a logic operation block performing a NOR operation with respect to two inputs. Thus, the output portion 413 outputs a NOR operation result with respect to data information stored in the latch circuit 412 and another external input signal Q3 as an output signal Q.

The structure and operation of the input portion 411 and the latch circuit 412 are the same as those of the second input portion 321 and the second latch circuit 322 illustrated in FIG. 3. Thus, detailed descriptions of the input portion 411 and the latch circuit 412 are omitted.

Referring to FIG. 5, a flip-flop 510 includes an input portion 511, a latch circuit 512, an output portion 513 and a pulse generator 514. The pulse generator 514 receives a clock signal CLK, and then outputs a pulse signal PS having a pulse width smaller than the clock signal CLK. The input portion 511 transmits an output signal with respect to an external input signal D to the latch circuit 512 in response to the pulse signal PS. The latch circuit 512 stores one bit data information with respect to the output signal of the input portion 511. The output portion 513 includes a logic operation block performing a NAND operation with respect to three inputs. Thus, the output portion 513 outputs a NAND operation result with respect to data information stored in the latch circuit 512 and external input signals Q3, Q4 as an output signal Q.

The structure and operation of the input portion 511 and the latch circuit 512 are the same as those of the second input portion 321 and the second latch circuit 322 illustrated in FIG. 3. Thus, detailed descriptions of the input portion 511 and the latch circuit 512 are omitted.

Referring to FIG. 6, a flip-flop 610 includes an input portion 611, a latch circuit 612, an output portion 613 and a pulse generator 614. The pulse generator 614 receives a clock signal CLK, and then outputs a pulse signal PS having a pulse width smaller than the clock signal CLK. The input portion 611 transmits an output signal with respect to an external input signal D to the latch circuit 612 in response to the pulse signal PS. The latch circuit 612 stores one bit data information with respect to the output signal of the input portion 611. The output portion 613 includes a logic operation block performing a NOR operation with respect to three inputs. Thus, the output portion 613 outputs a NOR operation result with respect to data information stored in the latch circuit 612 and external input signals Q3, Q4 as an output signal Q.

The structure and operation of the input portion 611 and the latch circuit 612 are the same as those of the second input portion 321 and the second latch circuit 322 illustrated in FIG. 3. Thus, detailed descriptions of the input portion 611 and the latch circuit 612 are omitted.

In ASIC circuitry, the flip-flop in accordance with an exemplary embodiment of the present inventive concept may be a standard cell providing a storage function.

According to the flip-flop structure and operation in accordance with an exemplary embodiment of the present inventive concept, a delay of the entire logic operation can be reduced while stably driving an external load.

The above-disclosed subject matter is to be considered illustrative, and not restrictive, and the appended claims are intended to cover all modifications, enhancements, and other embodiments, which fall within the spirit and scope of the inventive concept. Thus, the scope of the inventive concept is to be determined by the following claims and their equivalents, and not restricted or limited by the foregoing detailed description.

What is claimed is:

1. A logic circuit comprising:
a first flip-flop circuit, comprising:
    a first flip-flop circuit input portion configured to receive a first flip-flop circuit first signal;
    a first flip-flop circuit storage portion configured to receive a first flip-flop circuit second signal outputted from the first flip-flop circuit input portion; and
    a first flip-flop circuit output portion configured to receive a first flip-flop circuit third signal outputted from the first flip-flop circuit storage portion;
a second flip-flop circuit, comprising:
    a second flip-flop circuit input portion configured to receive a second flip-flop circuit first signal;
    a second flip-flop circuit storage portion configured to receive a second flip-flop circuit second signal outputted from the second flip-flop circuit input portion; and
    a second flip-flop circuit output portion configured to receive a second flip-flop circuit third signal outputted from the second flip-flop circuit storage portion, and
a load unit, comprising:
    a first logical gate configured to receive a first flip-flop circuit fourth signal outputted from the first flip-flop circuit output portion; and
    a second logical gate configured to receive a second flip-flop circuit fourth signal outputted from the second flip-flop circuit output portion,
    wherein the load unit performs a first NOT operation with respect to the first flip-flop circuit fourth signal,
    wherein an OR operation is performed on a result of the first NOT operation and the second flip-flop circuit fourth signal,
    wherein a second NOT operation is performed on a result of the OR operation,
    wherein a NAND operation is performed on a result of the second NOT operation and first flip-flop circuit fourth signal, and
    wherein a result of the NAND operation provides an output signal of the load circuit.

2. The logic circuit of claim 1, wherein the first logical gate and the second logical gate are different logical gates.

3. The logic circuit of claim 1,
wherein the first flip-flop circuit input portion and the second flip-flop circuit input portion each comprises a first PMOS transistor, a second PMOS transistor, a first NMOS transistor and a second NMOS transistor sequentially and serially connected to each other between a supply voltage and ground,
wherein the second NMOS transistor is configured to receive a pulse signal, wherein the first PMOS transistor is configured to receive an inverted pulse signal, and
wherein the second PMOS transistor and the first NMOS transistor are each configured to receive the first signal.

4. The logic circuit of claim 1, wherein the first flip-flop circuit storage portion and the second flip-flop circuit storage portion are latch circuits.

* * * * *